(12) United States Patent
Klein et al.

(10) Patent No.: US 10,025,756 B2
(45) Date of Patent: Jul. 17, 2018

(54) SELECTION AND USE OF REPRESENTATIVE TARGET SUBSETS

(71) Applicant: KLA-Tencor Corporation, Milpitas, CA (US)

(72) Inventors: Dana Klein, Haifa (IL); Sven Jug, Austin, TX (US)

(73) Assignee: KLA-Tencor Corporation, Milpitas, CA (US)

(*) Notice: Subject to any disclaimer, the term of this patent is extended or adjusted under 35 U.S.C. 154(b) by 867 days.

(21) Appl. No.: 14/508,469

(22) Filed: Oct. 7, 2014

(65) Prior Publication Data

US 2015/0025846 A1 Jan. 22, 2015

Related U.S. Application Data

(63) Continuation of application No. PCT/US2014/044443, filed on Jun. 26, 2014.

(60) Provisional application No. 61/840,966, filed on Jun. 28, 2013.

(51) Int. Cl.
G06F 17/18 (2006.01)
G03F 7/20 (2006.01)
G05B 19/418 (2006.01)

(52) U.S. Cl.
CPC .......... G06F 17/18 (2013.01); G03F 7/70633 (2013.01); *G05B 19/41875* (2013.01); *Y02P 90/22* (2015.11)

(58) Field of Classification Search
CPC .. G01N 1/28; G01N 33/00; G01N 2033/0095; G06F 17/18

USPC ........................................................ 702/179
See application file for complete search history.

(56) References Cited

U.S. PATENT DOCUMENTS

| 7,749,666 B2* | 7/2010 | Gassner ............... G03F 7/70641 356/125 |
| 2007/0030479 A1 | 2/2007 | Park et al. |
| 2007/0258074 A1* | 11/2007 | Moest ..................... G03F 9/7011 355/55 |
| 2009/0043527 A1* | 2/2009 | Park ................... G05B 23/0221 702/123 |
| 2009/0287440 A1* | 11/2009 | Kulkarni .......... G05B 19/41875 702/82 |

(Continued)

FOREIGN PATENT DOCUMENTS

TW 201220353 A 5/2012

*Primary Examiner* — Stephanie Bloss
(74) *Attorney, Agent, or Firm* — Suiter Swantz pc llo

(57) ABSTRACT

Methods and respective modules which reduce sample size and measurement duration of metrology parameters by selecting a relatively small subset of measured targets to represent a distribution of parameter measurements of a large number of targets. The subset is selected by sampling a substantially equal number of measurements from each of a selected number of quantiles of the distribution. The methods and modules allow identification of targets which represent correctly the whole target measurement distribution. The methods and modules optimize quantiles and sample size selections, using accuracy scores and estimations of the robustness of the selections. Sampling and selections may be carried out iteratively to reach specified criteria that match the results which can be derived when considering the whole distribution.

30 Claims, 8 Drawing Sheets

(56) References Cited

U.S. PATENT DOCUMENTS

| | | |
|---|---|---|
| 2010/0005442 A1* | 1/2010 | Ghinovker .......... G03F 7/70633 716/55 |
| 2011/0125440 A1 | 5/2011 | Lee et al. |
| 2011/0164809 A1 | 7/2011 | Shibuya et al. |
| 2012/0029856 A1 | 2/2012 | Cohen et al. |
| 2012/0208301 A1 | 8/2012 | Izikson et al. |

* cited by examiner

```
200
├── 210 — REDUCING SAMPLE SIZE AND MEASUREMENT
│         DURATION OF PARAMETERS
├── 215 — SELECTING A SUBSET OF THE TARGETS,
│         THE MEASUREMENTS OF WHICH REPRESENT THE
│         DISTRIBUTION OF MEASUREMENTS FROM ALL TARGETS
├── 220 — SAMPLING AN EQUAL NUMBER OF MEASUREMENTS
│         FROM DIFFERENT DISTRIBUTION QUANTILES
├── 222 — DEFINING A REPRESENTATION CRITERION
├── 224 — CALCULATING ACCURACY SCORE(S)
│         FOR THE SAMPLED TARGETS TO QUANTIFY
│         THE QUALITY OF REPRESENTATION
├── 226 — REITERATING THE SAMPLING AND THE SELECTIONS
│         TO REACH THE DEFINED REPRESENTATION CRITERION
├── 228 — CARRYING OUT THE SELECTION ACCORDING TO A
│         MEDIAN OF THE ACCURACY SCORE DISTRIBUTION
└── 229 — INCORPORATING CONSIDERATIONS
          CONCERNING TARGET CHARACTERISTICS
```

Figure 4

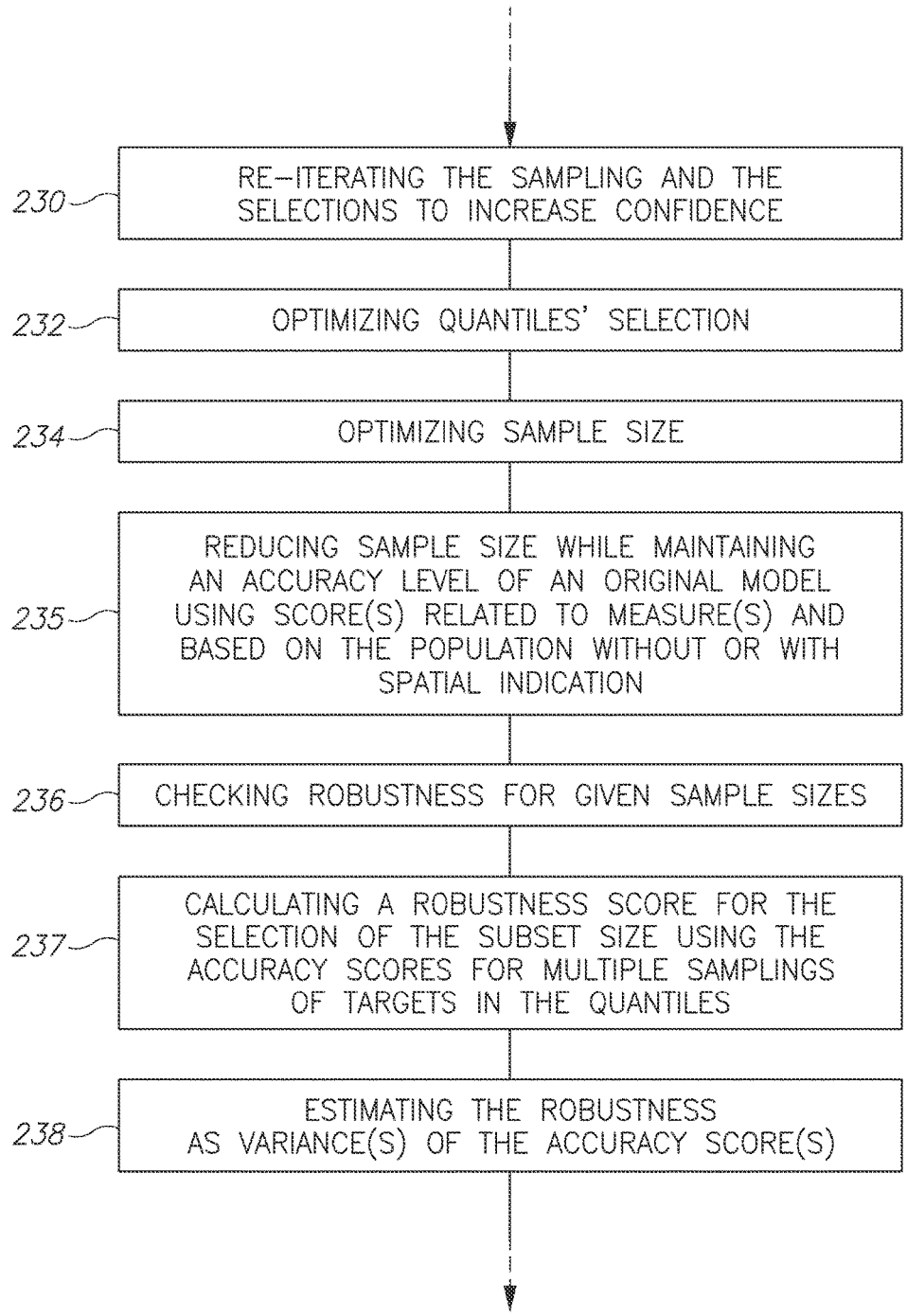
Figure 4 (cont. 1)

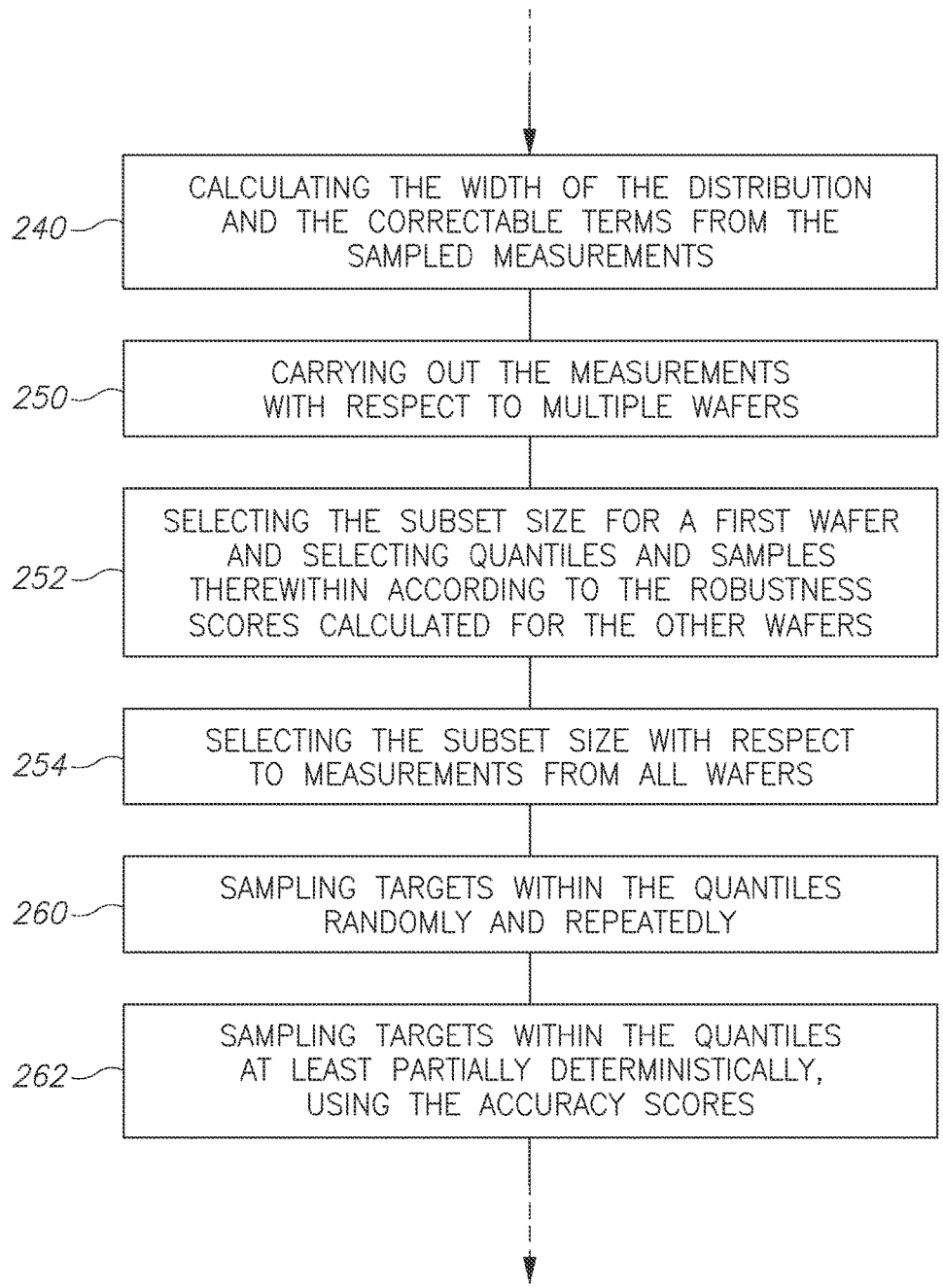
Figure 4 (cont. 2)

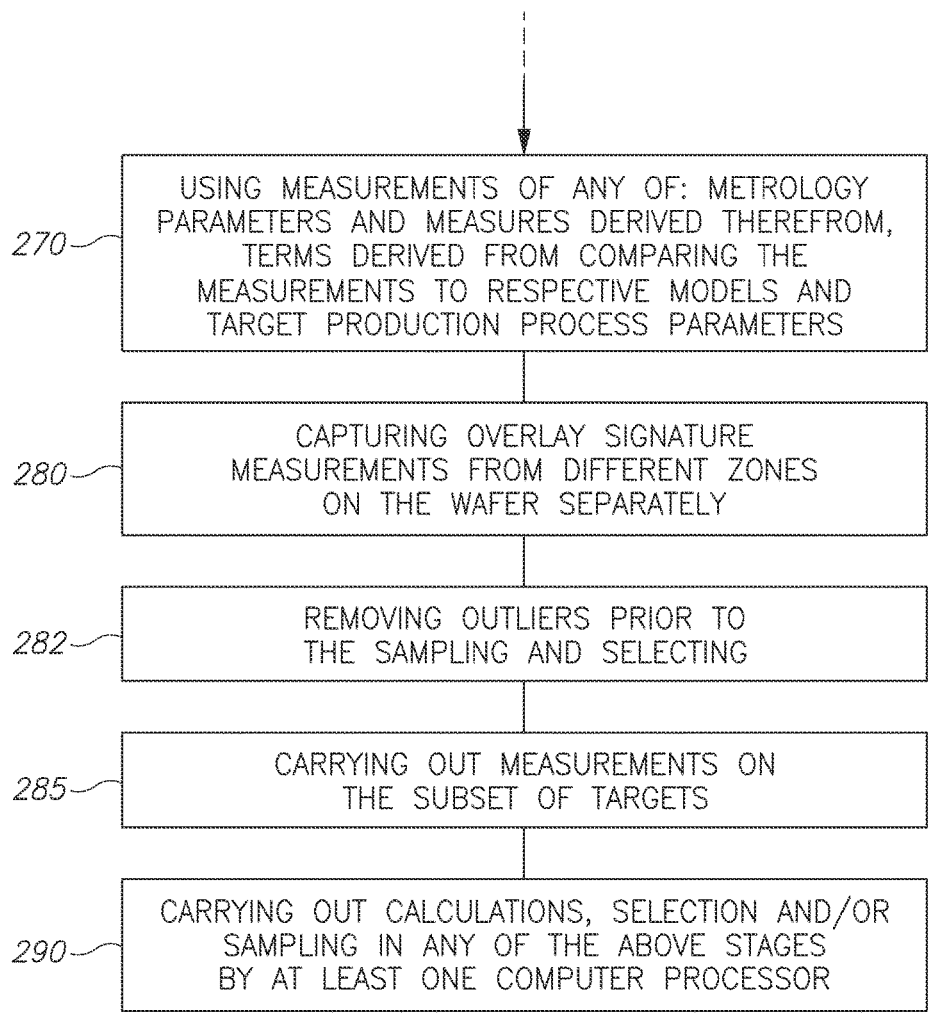
Figure 4 (cont. 3)

SELECTION AND USE OF REPRESENTATIVE TARGET SUBSETS

CROSS REFERENCE TO RELATED APPLICATIONS

This application is filed under 35 U.S.C. § 120 and § 365(c) as a continuation of International Patent Application No. PCT/US2014/044443, filed Jun. 26, 2014, which application claims the benefit of U.S. Provisional Patent Application No. 61/840,966 filed on Jun. 28, 2013, which applications are incorporated herein by reference in their entirety.

BACKGROUND OF THE INVENTION

1. Technical Field

The present invention relates to the field of metrology, and more particularly, to statistical analysis and sampling of measurements' distribution.

2. Discussion of Related Art

Metrology targets are designed to enable the measurement of parameters that indicate the quality of wafer production steps and quantify the correspondence between design and implementation of structures on the wafer. Metrology targets are produced all over the wafer fields and analysis of measurement results from the targets yield an estimation of metrology parameters across the wafer.

SUMMARY OF THE INVENTION

One aspect of the present invention provides a method comprising reducing sample size and measurement duration of metrology parameters by selecting a subset n of measured targets to represent a distribution of parameter measurements of a plurality N of targets, wherein the subset n, with n<<N, is selected by sampling a substantially equal number of measurements from each of a selected number of quantiles of the distribution.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 4 is a high level schematic flowchart of a method, according to some embodiments of the invention.

DETAILED DESCRIPTION OF THE INVENTION

Figure 1A:
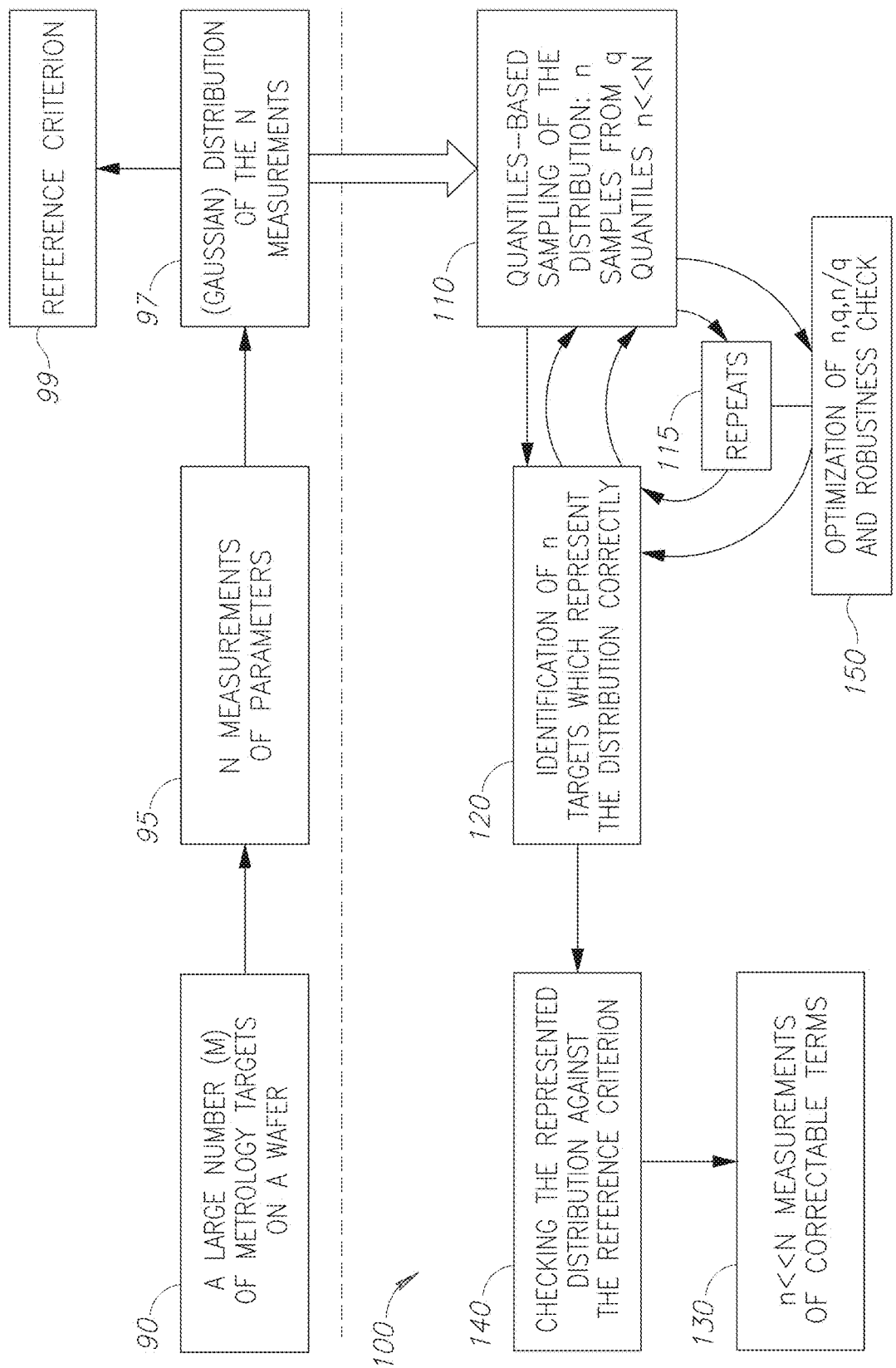
FIG. 1A is a high level schematic block diagram of the operation of a module, according to some embodiments of the invention.

Prior to the detailed description being set forth, it may be helpful to set forth definitions of certain terms that will be used hereinafter.

The term "parameter" as used in this application refers to any measurable quantity which may be derived by metrology measurement, for example geometric parameters such as overlay (OVL) and critical dimension (CD), calculated quantities such as tool induced shift (TIS) and measurement quality merits, and derived quantities such as scanner dose and focus. The parameters may refer to any measurement direction, and are understood to include any combination of measurable quantities. Parameters may comprise any of the measured quantities themselves, or derivations of the measured quantities with respect to given metrology models, for example a systematic part of measurable quantities (e.g., a component which may be attributed to a systematic source) and/or a random part of measurable quantities (e.g., residuals with respect to a corresponding systematic part, which cannot be attributed to a systematic source).

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Methods and respective modules are provided, which reduce sample size and measurement duration of metrology parameters by selecting a relatively small subset of measured targets to represent a distribution of parameter measurements of a large number of targets. The subset is selected by sampling a substantially equal number of measurements from each of a selected number of quantiles of the distribution. The methods and modules allow identification of targets which represent correctly the whole target measurement distribution. The methods and modules optimize quantiles and sample size selections, using accuracy scores and estimations of the robustness of the selections. Sampling and selections may be carried out iteratively to reach specified criteria that match the results which can be derived when considering the whole distribution.

FIG. 1A is a high level schematic block diagram of the operation of a module 100, according to some embodiments of the invention. Module 100 may be at least partially embedded in computer hardware, and configured to carry out any of the stages of method 200 described below. Module 100 may be fully or partially embedded in a metrology tool (not shown).

The operation of module 100 is illustrated in FIG. 1A with respect to prior art procedures, which are illustrated above the broken line, and may be used to derive a baseline estimation for the performance of module 100 as well as for selection of the specific parameters, as explained below. In the prior art, a metrology criterion is defined to check whether metrology measurements, taken over all or most targets on a wafer (M targets 90 used to derive N measurements of parameters 95), indicate correct production of the wafer. Moreover, the metrology measurements are used to derive corrections for the production process. For example, the measurements may be used to construct a metrology model, from which correctable terms are derived and an estimation of residuals (remaining statistical error) is checked against the metrology criterion. For example, the variance of a distribution of the residuals, measured e.g., by 3σ of a (Gaussian) distribution 97 of the residuals derived from the model, is compared to the metrology criterion. In the present invention, the metrology criterion may be taken as a reference criterion 99 to which the approximation described above is compared. The measurements and criterion may relate to different metrology parameters such as overlay, critical dimension (CD), process parameters such as focus and dose etc. or to model derived parameters such as correctable terms and residuals. In the prior art, the large number of targets often does not allow measuring all targets for every wafer due to time constraints, and an arbitrary number of measurements are conducted instead, commonly selected with respect to the targets' spatial distribution.

In contrast, module 100 of the disclosed invention reduces sample size and measurement duration of metrology parameters by selecting a subset n of measured targets to represent a distribution of parameter measurements of a plurality N of targets. The subset n, with n<<N, is selected by sampling a substantially equal number of measurements from each of a selected number of quantiles of the distribution.

For example, module 100 may carry out a quantiles-based sampling 110 of the distribution, for example by taking n/q samples from q quantiles and identifies 120 the subset of n targets which represent the distribution correctly. The correct representation may be tested against reference criterion 99 (140) or be tested using statistical measures (see below). The resulting subset of n<<N representative targets may be used in further measurements to provide the required metrology parameters 140, such as correctables and residuals, while avoiding the need to measure all N targets as well as the arbitrary selection. The inventors have found that measurement time may be cut to 20% (e.g., from N between 1000-1200 to subset n between 100-300) using the disclosed module, without compromising the accuracy of the metrology criterion check. Module 100 and associated method 200 may be adjusted with respect to various requirements regarding the metrology measurement procedures, types of targets, metrology criteria etc.

In certain embodiments, any one of subset size n, number of quantiles q and sample size from each quantile n/q may be determined, and the other of n, q and n/q may be repeatedly varied 115. One or more accuracy scores may be used to estimate the results of each reiterated selection until optimal selection of the parameters is achieved. Module 100 may define a representation criterion using the distribution of measurements of the N targets, and calculate the accuracy score with respect thereto.

The estimation may be two tiered, with the selection of the first one of n repeated and checked for robustness 150 and/or optimized with respect to the accuracy and robustness scores. The varied other of n, q and n/q may be associated respective accuracy scores and the determined one of n, q and n/q may varied and associated with respective robustness scores derived from the accuracy scores.

The disclosed invention is applicable to any type of metrology parameter derived by any metrology measurement, for example geometric parameters such as overlay (OVL) and critical dimension (CD), calculated quantities such as tool induced shift (TIS) and measurement quality merits, and derived quantities such as scanner dose and focus. The parameters may refer to any measurement direction (e.g., X and/or Y), and are understood to include any combination of measurable quantities. Parameters may comprise any of the measured quantities themselves, as well as model derived parameters such as a systematic part of measurable quantities (e.g., a component which may be attributed to a systematic source) and/or a random part of measurable quantities (e.g., residuals with respect to a respective systematic part, which cannot be attributed to a systematic source).

In certain embodiments, quantiles selection and sample size may be optimized 150 with respect to specific metrology tasks at hand, to achieve maximal sampling and measurement efficiency as well as robustness of the selected targets to random fluctuations. In particular, sample size n may be reduced while maintaining the accuracy level of the original measurement distribution 97 using one or more accuracy scores which are based on the population of measurements without any spatial indication of the target's position or with additional reference to the targets' spatial distribution (e.g., spatial information such as inter-field position, intra-field location or radius may be taken into account with respect to different parameters). In certain embodiments, new samples may be constructed iteratively, point by point, while monitoring the population's score.

The accuracy scores may be derived from different sources. For example, the accuracy score may be measured using a residuals distribution of a model. In another example, the accuracy score may be measured using measurement quality merit(s) distribution(s) derived from any measurement parameter.

In certain embodiments, each point of the distribution may comprise a plurality of measures or parameters. For each measure an accuracy score may be calculated on the population and the samples may be selected to satisfy simultaneously all accuracy scores relating to all parameters.

In certain embodiments, selection of quantiles and/or selection of sample size may be reiterated to optimize a robustness of these selections, i.e., to ensure low sensitivity of the target selection to various measurement conditions and measurement results, and to ensure that the selection of the subset of targets indeed provides accurate enough representations of the whole distribution under various conditions. The robustness of the selections may be quantified by a robustness score, which may for example be based on the accuracy scores, e.g., comprise the variance of the accuracy scores across different samples of the same size, and/or comprise the variance of the accuracy scores across different wafers. The quality of subset selection may be estimated using the accuracy scores, and a specified threshold for the accuracy scores may be set as an indication of the quality of the results.

In certain embodiments, outliers may be removed from the population of measurements before applying the algorithm. In certain embodiments no such removal may be carried out, in order to construct a sampling which represents the complete distribution.

Figure 1B:
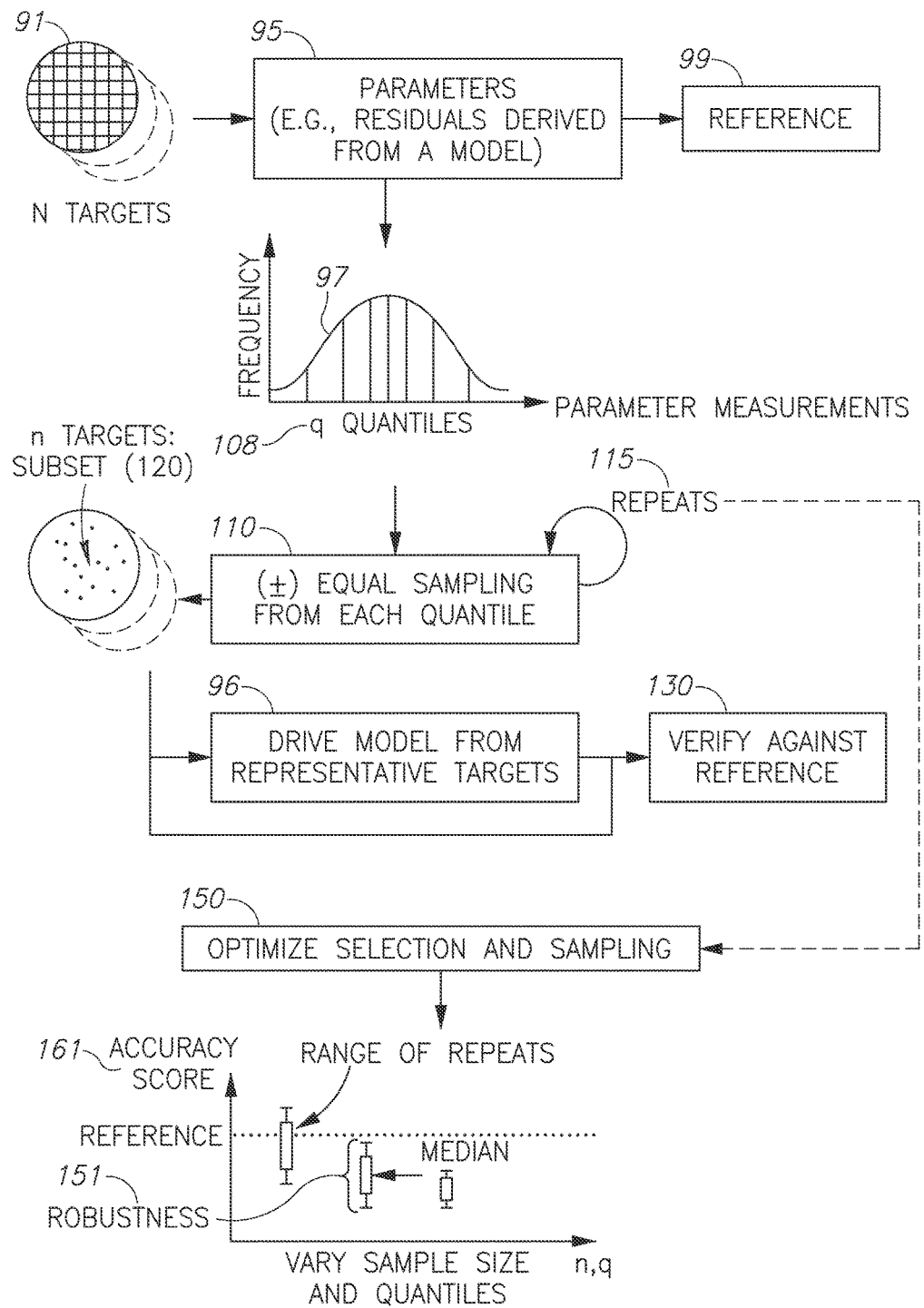
FIG. 1B is a high level schematic illustration of an exemplary implementation, according to some embodiments of the invention.

FIG. 1B is a high level schematic illustration of an exemplary implementation, according to some embodiments of the invention. The illustrated exemplary implementation and variations thereof may be used by module 100 and/or method 200 to carry out the disclosed invention. FIG. 1B schematically illustrates non-limiting embodiments of a way to select a subset of n representative targets from a total of N targets on a least one wafer 91.

A representation criterion may be defined as reference 99 using complete distribution 97 of parameters measurements of all or most of N targets on wafer(s) 91.

Subset size n and/or number of quantiles q 108 and/or sample size n/q from each quantile may be selected considering their interdependencies. For example, a sample size n may be selected first and fixed, and then the number of quantiles q 108 (and resulting sample size from each quantile n/q) may be varied and optimized. In another example, number of quantiles q 108 may be selected first and fixed, and then the subset size n or sample size from each quantile n/q (and thus, respectively, n/q and q) may be varied and optimized. In another example, sample size from each quantile n/q may be selected first and fixed, and then the subset size n or number of quantiles q 108 (and thus, respectively, q and n) may be varied and optimized. It is noted that outliers may be removed at any stage, and that the number of samples from each quantiles n/q must not be strictly equal for different quantiles but substantially equal, depending on defined criteria. Any of the examples listed above leads to quantile-based sampling 110 resulting in respective subsets of targets which are used to derive measurement parameters and/or model-based derived quantities 96 which are checked against reference 99 to define accuracy score(s) of the subset selection.

Optimization of selection and sampling 150 may be carried out by varying any of n, q, n/q and repeatedly sampling specific targets into the subset of targets to calculate accuracy score(s) 161 of each of the samples. The distributions of accuracy score(s) 161 with respect to the varied subset size n, number of quantiles q 108 and/or sample size n/q may be used for several purposes such as: comparison of the module performance with the selected sizes and samples to reference criterion 99, definition of robustness score(s) 151 for the specific selection of n, q and/or n/q and selection of a specific sample of targets to construct the subset of n targets, e.g., as a median of the distribution of accuracy scores.

Figure 2:
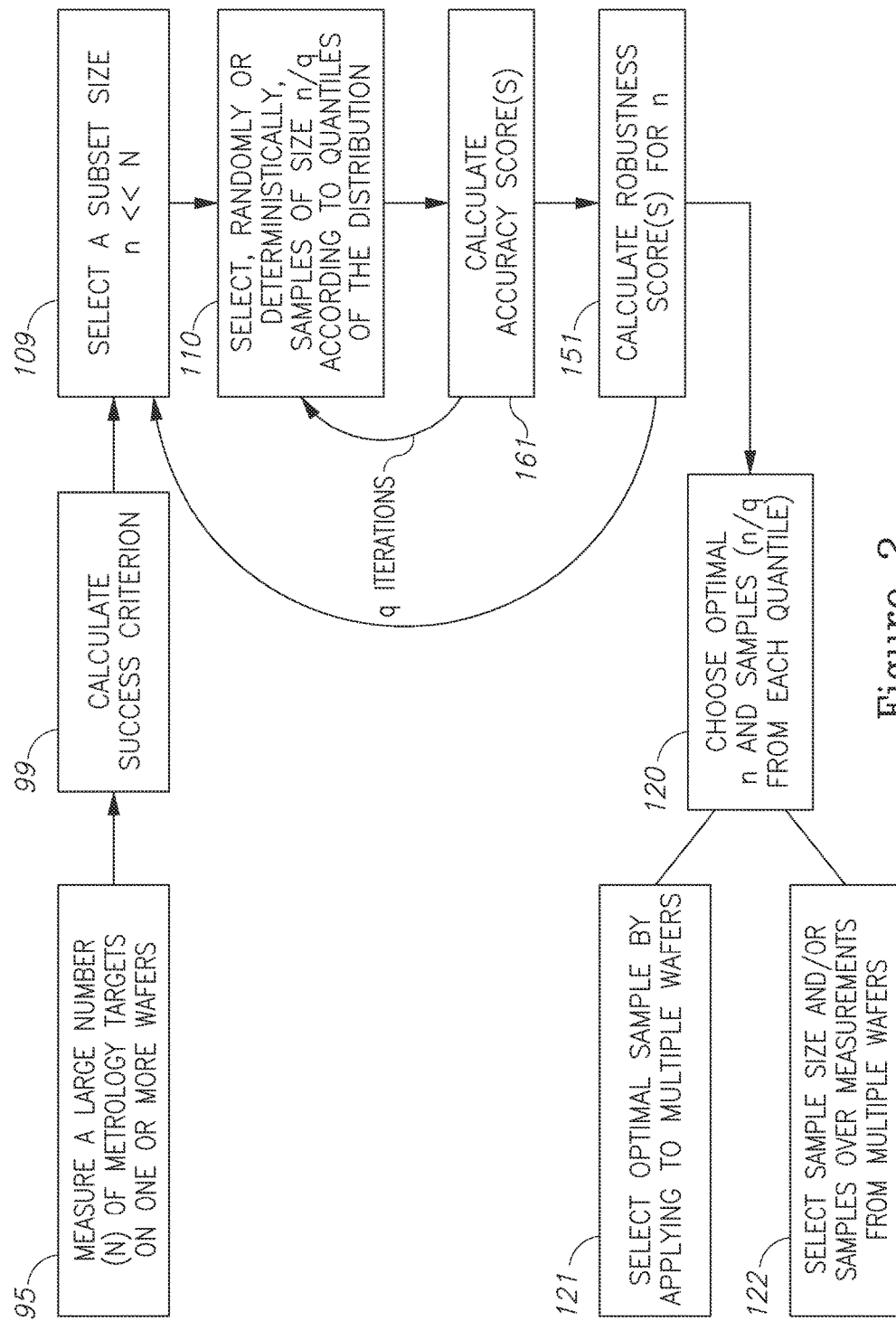
FIGS. 2 and 3 are further high level schematic block diagrams of the operation of the module, according to some embodiments of the invention.
Figure 3:
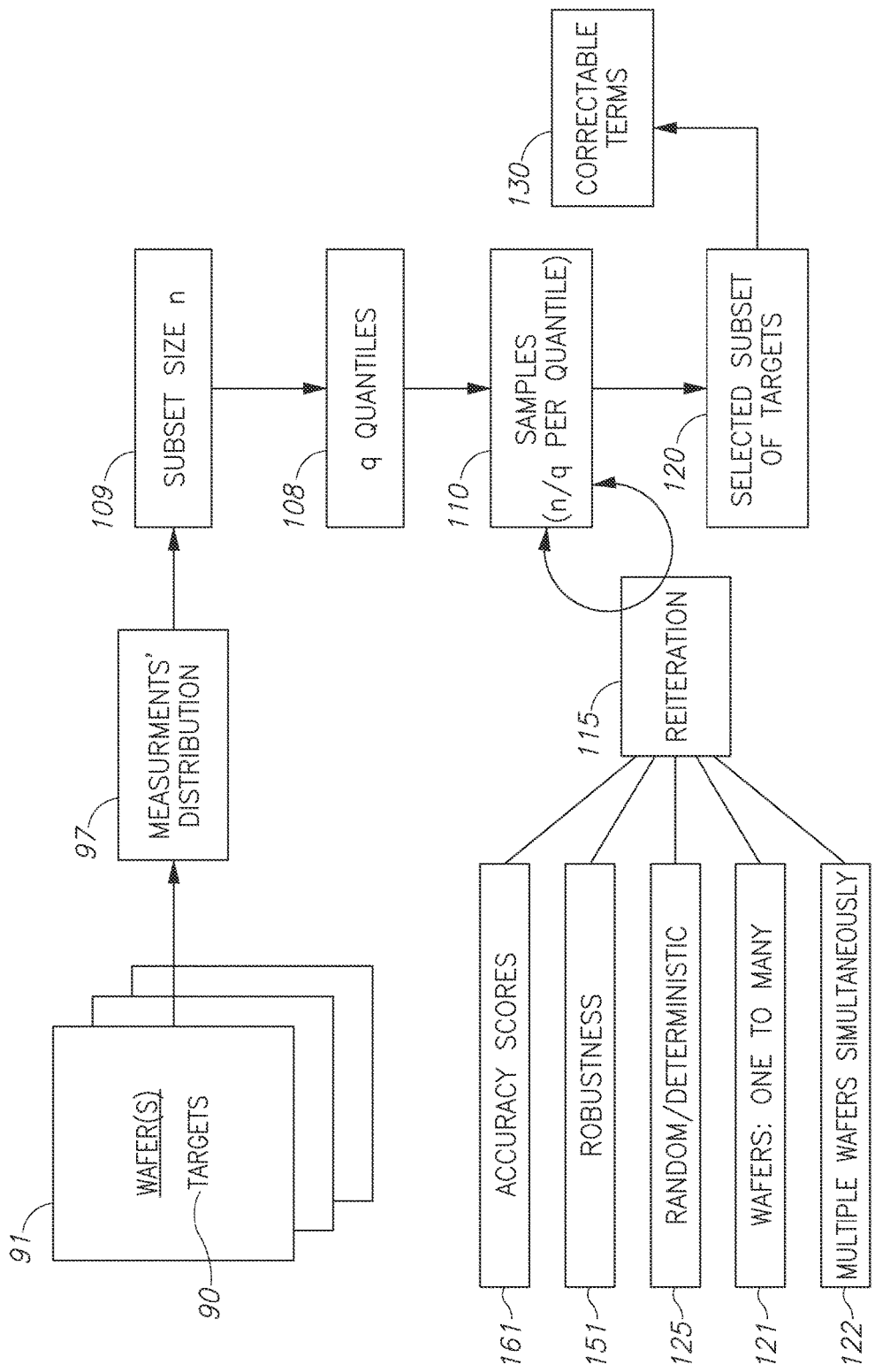

FIGS. 2 and 3 are further high level schematic block diagrams of the operation of module 100, according to some embodiments of the invention. FIGS. 1A, 1B, 2 and 3 illustrate certain embodiments of the disclosed invention from different perspectives, and any combination and variation of elements from FIGS. 1A, 1B, 2 and 3 is likewise considered part of the presently disclosed invention.

Referring to FIG. 2, by measuring a large number (N) of metrology targets on one or more wafers (95), a success criterion 99 may be calculated and later used as reference to measure the quality of specific subset selections 109, of n targets out of N targets, with n<<N. In the illustrated example, subset size n is selected first, and then the number of quantiles q and sample sizes n/q are iteratively selected 110, and quantified by calculated accuracy scores 161. Robustness measure(s) are calculated over the range of reiterated samples to indicate the robustness of the selection of subset n 151, and subset size n selection 109 may be likewise reiterated to reach a given required robustness level. Resulting from this iterative process, are optimal values for n, q and an optimal sampling of the targets, with essentially n/q targets from each of the q distribution quantiles 120. In case of multiple wafers 91, the optimization process disclosed above may be carried out with respect to a first wafer and reiterated with respect to the rest of the wafers 121, or the optimal sample may be selected as illustrated above, by taking measurements of the N targets from multiple wafers into account 122.

Referring to FIG. 3, measurements' distribution 97 relating to a large number of targets 90 from multiple wafers 91 may be used to carry out subset size selection 109 and/or quantile number selection 108 and/or sample size selection 110, under consideration of the interdependencies of the selected quantities. The selection and sampling steps may be reiterated 115 to yield a selected subset of targets 120, from which relevant metrology measures may be derived 130 for the wafers that are measured after the ones used to select the subset of targets. Reiteration 115 may be carried out with respect to any of the selected sizes and samples, possibly in a nested manner, to yield any of the following: accuracy scores 161, robustness scores 151, random or deterministic sampling (based on the reiterations) 125, application of samplings from wafer to other wafers 121 and sampling of multiple wafers 122.

FIG. 4 is a high level schematic flowchart of a method 200, according to some embodiments of the invention. Method 200 may comprise any of the following stages. Certain embodiments comprise computer program products comprising a computer readable storage medium having computer readable program embodied therewith. The computer readable program may be configured to carry out, at least partially, any of the stages of method 200.

Method 200 comprises reducing sample size and measurement duration of metrology measurements of wafers and derived parameters (stage 210), by selecting a subset of measured targets (stage 215), the measurements of which represent the distribution of measurements from all targets, and sampling a substantially equal number of measurements from different distribution quantiles of the model (stage 220).

In certain embodiments, method 200 may comprise defining a representation criterion (stage 222), calculating at least one accuracy score for the sampled targets to quantify the quality of representation of the whole distribution of measurements by the distribution of measurements of the targets in the subset (stage 224), in particular with respect to derived metrology measurements which indicate required operations which are relevant to the lithography process, such as correctable terms and residuals derived from an overlay model (e.g., an OLS, Ordinary Least Squares, overlay model).

Method 200 may further comprise reiterating samplings 220 and selections 215 (see also FIGS. 1A, 1B, 2 and 3 above) to reach the defined representation criterion (stage 226). In certain embodiments, selection 215 may be carried out according to the median of accuracy score distribution(s) resulting from sampling 220 (stage 228, and see FIG. 1B). The sampled n/q targets may be selected according to a median of a distribution of the respective at least one accuracy score for all sampled n/q targets.

In certain embodiments, selecting the subset of targets 215 may further comprise incorporating considerations concerning target characteristics (stage 229) such as target configurations and spatial distribution, for example spatial information may comprise at least one of: inter-field position, intra-field location and radius.

Method 200 may further comprise re-iterating sampling 220 and selecting 215 to increase confidence (stage 230). Method 200 may comprise any of optimizing quantiles selection (stage 232) and optimizing sample size (stage 234) as explained above.

Method 200 may further comprise reducing sample size while maintaining an accuracy level of an original model using score(s) related to measure(s) and based on the population without or with spatial indication (stage 235). Method 200 may further comprise any of checking robustness for given sample sizes (stage 236), calculating a robustness score for the selection of the subset size using the accuracy scores for multiple samplings targets in the quantiles (stage 237) and estimating the robustness as variance(s) of the accuracy score(s) (stage 238). Method 200 may comprise calculating a robustness score for the selection of subset size n, using a plurality of values of the at least one accuracy score for a respective plurality of samplings of the n/q targets. For example, the robustness score may be related to a variance or any other statistical measure of the plurality of values of the at least one accuracy score.

Method 200 may further comprise calculating a distribution width and/or correctable terms from measurements of the selected subset of targets (stage 240).

Method 200 may further comprise carrying out the measurements with respect to multiple wafers (stage 250), and either selecting the subset size for a first wafer and selecting quantiles and samples therewithin according to the robustness scores calculated for the other wafers (stage 252) and/or selecting the subset size with respect to measurement from all wafers, iteratively or simultaneously (stage 254).

Method 200 may comprise sampling targets within the quantiles randomly and repeatedly (stage 260) and/or sampling targets within the quantiles at least partially deterministically, using the accuracy scores (stage 262).

Method 200 may relate to measurements of any of: metrology parameters, metrology measures derived from metrology parameters, metrology quality merits, correctable terms derived from the parameters using a metrology model, residuals of metrology parameters derived from a metrology model and target production process parameters (stage 270).

In certain embodiments, the measurements relate, along at least one measurement direction, to at least one of: overlay, tool induced shift, a measurement quality merit. In certain embodiments, the measurements may relate to at least one of scanner dose and focus. In certain embodiments, the measurements may relate to overlays derived from a metrology overlay model. For example, the measurements may relate to residuals of metrology parameters derived from a metrology model, the distribution of the residuals is Gaussian and the metrology model is an Ordinary Least Squares (OLS) overlay model. In another example, method 200 may further comprise capturing, separately, overlay signature measurements from different zones on the at least one wafer having the measured targets (stage 280). Combinations of these measurements, as well as additional measurements may be taken into account and/or be carried out with respect to the selected subset of targets (stage 285). In certain embodiments, method 200 may comprise, at any stage, removing outliers prior to the sampling and selecting (stage 282). At least one of the selecting, the sampling and the calculating may be carried out by at least one computer processor (stage 290). It is noted that method 200 is not limited to overlay models, and may related to CD models, process parameters models etc.

Advantageously, the disclosed sampling algorithm may provide wafer and field overlay signatures, enable criteria checking (e.g., reprocessing thresholds) and derive reliable correctable terms in face of a constantly growing number of required targets and measurements. In contrast to the prior art, which conducts full sampling of the measured targets in order to calculate the characteristics of their distribution (such as average $\mu$, standard deviation $\sigma$, residuals $3\sigma$), the disclosed sampling algorithm identifies representative targets by a specified sampling procedure, and calculates the characteristics of their distribution and/or the metrology criterion (e.g., $3\sigma$ (using measurements from all targets)–$3\sigma$(using measurements from subset targets only)$<\Delta=0.5$ nm as an example for a predefined $\Delta$) using measurements of the subset of representative targets. Thus, the disclosed sampling algorithm reaches an optimized sample having a size which is significantly reduced with respect to the overall number of targets.

In certain, non-limiting, embodiments, assuming a Gaussian distribution of the measurement, the disclosed sampling algorithm maintains the original distribution parameters and avoids changing them when using the subset of targets. Sampling measurements and selecting the subset of targets in equal numbers for quantiles of the distribution ensures conservation of the distribution characteristics and thus an appropriate representation of the distribution. Selecting the number of quantiles and optionally reiterating the sampling and selection assures a high level of confidence in the appropriate representation of the distribution while measuring a small number of targets included in the subset.

In certain embodiments, outliers may be removed prior to application of the algorithm. In certain embodiments, outliers may be retained, but held to their reasonable importance by the reiteration of sampling and selection. In certain embodiments, removal of outliers may employ a method such as Inter Quartile Range (IQR), based on the range between the third quartile and the first quartile of the distribution. This range holds by definition half the data points centered on the distribution mean.

As a non-limiting example, the disclosed sampling algorithm may use eight quantiles (q, e.g., q=8). Each of the eight quantiles consists of the same amount of measurement points (e.g., 12.5%). The optimal sample is generated by randomly reducing the number of measurement points from the residuals distribution's eight percentiles (n/q, e.g., n/q=20) while keeping the frequencies of each quantile balanced across the eight quantiles. Keeping the frequencies of the eight quantiles balanced assures the replication of distribution characteristics. The inventors have found out that such optimization may reduce the sample size (N, e.g., N=800) by >75% to n (e.g., n=160), while keeping the distribution's statistical characters fixed, meaning capturing the same signatures upon wafer and field levels as when using all N target measurements.

The result is thus a sparse sampling-optimized map of the targets on the wafer. The subset of targets may be used for generating correctable terms and then applying those to the full map, maintaining the $3\sigma$ residuals within the performance criterion $\Delta$ (e.g., 0.5 nm, criterion $\Delta$ may range e.g., between 0.1-1 nm) from the $3\sigma$ residuals resulting from the model when using the full distribution. To assure robustness, for different sample sizes, the sampling may be reiterated, e.g., 50 times, creating 50 different random samples. Clearly, any number of reiterations may be selected, or any stopping criterion may be selected to continue the reiterations until the stopping criterion is reached. The metrology criterion may be calculated for all reiterations and after constructing a distribution of 50 matching criterions per sample size, the optimal sample may be selected as the one generating the median of the lowest sample size which yields a distribution of matching criterions that lies below the success criterion limit $\Delta$, e.g., 0.5 nm. The sample size n may be made smaller while maintaining the even frequency of the measurement points in each of the quantiles, as long as the distribution characteristics are maintained. Clearly, n and q cannot be reduced too much. The selected quantiles q and sample size n/q may be adjusted according to the quality of results with respect to the checked criteria and their sensitivity and/or stability. The inventors have found out that in certain cases using eight quantiles provide stable and reliable algorithm application on experimental data.

In certain embodiments, specified zones on the wafer may be defined to have distinct representations of the quantiles. Subsets of targets may be selected for each zone separately in a way that ensures correct representation of the distribution in the respective zone, as explained above. The zones may be determined e.g., by radius (distance from center of wafer), sector (e.g., quadrants) or any other production criteria (e.g., expected process inaccuracies, proximity to wafer or die edges etc.) and combinations thereof, and criteria for signature representations may be determined accordingly.

In certain embodiments, similar principles may be applied to uniform distributions, bimodal distribution, asymmetric distribution etc. In any of these distributions, a number of quantiles may be optimized and representative targets may be selected in each quantile to represent the overall target distribution.

In certain embodiments, target selection may be carried out using additional criteria, such as target characteristics and parameters of the targets' spatial distribution. For example, similar proportions of targets from different locations in the field may be incorporated in the selection, or similar proportions of targets of different types may be included in the subset.

Advantageously, the disclosed statistical sampling algorithm meets even harsh metrology criteria such as $3\sigma<\Delta=0.5$ nm by using the statistical characteristics of the well-known OLS model and reducing thereby the sample size by over 75%. This is the only algorithm that allows sparse sampling across the wafer and meets the matching and sample size requirements without causing a statistical bias. It is noted that the algorithm may be adapted to distributions other than Gaussian and overlay models other than OLS. Rather than optimizing the design of experiment when choosing a sample, this algorithm mimics the overlay signatures in practice and shows consistency within and across lots. This algorithm is applicable to both wafer and field levels without causing misalignments.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
defining a representation criterion;
acquiring one or more measurements of an N number of targets;
selecting a subset n of the N number of targets, wherein the subset n of the N number of targets includes a smaller number of targets than the N number of targets;
selecting one or more quantiles q based on a distribution of the one or more measurements of the N number of targets;
sampling a selected number of targets from each quantile q of the distribution, wherein the selected number of targets is equal to or proportional to the ratio between the values n and q;
calculating at least one accuracy score for the sampled selected number of targets equal to or proportional to the ratio between the values n and q to quantify an amount the sampled selected number of targets equal to or proportional to the ratio between the values n and q represent the distribution of the one or more measurements of the N number of targets;
reiterating at least one of the sampling the selected number of targets equal to or proportional to the ratio between the values n and q, the selecting of the subset n, the selecting of the number of quantiles q, or the calculating the at least one accuracy score until the at least one accuracy score is below the defined representation criterion;
selecting a subset m of the N number of targets after the calculated at least one accuracy score is below the defined representation criterion, wherein the subset m of the N number of targets includes a smaller number of targets than the N number of targets;
acquiring one or more measurements of the subset m of the N number of targets;
determining one or more correctable terms based on the one or more measurements of the subset m of the N number of targets; and
adjusting one or more sample selection criterion utilized by a metrology tool based on the one or more correctable terms,
wherein at least one of the selecting the subset n, the selecting the number of quantiles q, the sampling the selected number of targets equal to or proportional to the ratio between the values n and q, or the calculating at least one accuracy score is carried out by at least one computer processor.

2. The method of claim 1, further comprising:
calculating a robustness score for the subset n based on the at least one accuracy score for the subset n corresponding to the sampled number of selected targets equal to or proportional to the ratio between the values n and q.

3. The method of claim 2, wherein the robustness score is related to a variance of the at least one accuracy score.

4. The method of claim 2, wherein the at least one wafer includes a plurality of wafers, wherein the one or more measurements of the N number of targets are carried out with respect to the plurality of wafers.

5. The method of claim 4, wherein the subset n is selected for a first wafer of the plurality of wafers, wherein the selecting the number of quantiles q and the sampling of the selected number of targets equal to or proportional to the ratio between the values n and q are carried out based on the robustness score calculated for at least a second wafer of the plurality of wafers.

6. The method of claim 4, wherein the selecting the subset n of the N number of targets and the reiterating at least one of the sampling the n/q number of targets or the selecting of the subset n and the number of quantiles q are carried out based on the plurality of wafers.

7. The method of claim 1, wherein the sampling of the selected number of targets equal to or proportional to the ratio between the values n and q is random.

8. The method of claim 1, wherein the sampling the selected number of targets equal to or proportional to the ratio between the values n and q is deterministic, wherein the deterministic sampling is based on the at least one accuracy score.

9. The method of claim 1, wherein the sampled selected number of targets equal to or proportional to the ratio between the values n and q are selected based on a median of a distribution of the respective at least one accuracy score, wherein the median yields a distribution of representation criterions smaller than a selected representation criterion limit.

10. The method of claim 1, wherein the one or more measurements of the N number of targets are based on at least one of one or more metrology parameters, one or more metrology measurements acquired from the one or more metrology parameters, one or more metrology quality merits, one or more correctable terms acquired from the one or more metrology parameters using a metrology model, or one or more residuals of metrology parameters acquired from the metrology model and one or more target production process parameters.

11. The method of claim 1, wherein the one or more measurements of the N number of targets are based on, along at least one measurement direction, to at least one of an overlay, a tool induced shift, or a measurement quality merit.

12. The method of claim 1, wherein the one or more measurements of the N number of targets relate to at least one of: a scanner dose or a scanner focus.

13. The method of claim 1, wherein the one or more measurements relate to an overlay acquired from a metrology overlay model, wherein one or more overlay signature measurements are separately captured from different zones on the at least one wafer.

14. The method of claim 1, further comprising:
carrying out one or more additional measurements on the selected subset n of the N number of targets.

15. The method of claim 1, wherein the one or more measurements of the N number of targets are based on one or more residuals of metrology parameters acquired from a metrology model, wherein the distribution of the one or more residuals is a Gaussian distribution, wherein the metrology model is an Ordinary Least Squares (OLS) overlay model.

16. The method of claim 1, further comprising:
incorporating one or more target characteristics of the N number of targets during the selecting the subset n of the N number of targets.

17. The method of claim 16, wherein the one or more target characteristics comprise:
spatial information including at least one of an inter-field position, an intra-field location, or a radius.

18. The method of claim 1, further comprising:
removing one or more outliers prior to at least one of the sampling the selected number of targets equal to or proportional to the ratio between the values n and q, the selecting of the subset n, or the selecting of the number of quantiles q.

19. The method in claim 1, wherein the one or more correctable terms reduce at least one of a sample size selection or a measurement duration of the metrology tool.

20. A method comprising:
acquiring one or more measurements of an N number of targets of at least one wafer;
performing one or more calculations on the one or more measurements of the N number of targets;
selecting a subset m of an N number of targets based on the performed one or more calculations, wherein the subset m of the N number of targets includes a smaller number of targets than the N number of targets, wherein the subset m represents a distribution of the one or more metrology parameters of the N number of targets, wherein the subset m of the N number of targets is selected by sampling a selected number of one or more measurements from each of a selected number of quantiles q of the distribution of the one or more measurements of the N number of targets, wherein the selected number of the one or more measurements is equal to or proportional to the ratio between the values m and q;
acquiring one or more measurements of the subset m of the N number of targets;
determining one or more correctable terms based on one or more measurements of the subset m of the N number of targets; and
adjusting one or more sample selection criterion utilized by a metrology tool based on the one or more correctable terms,
wherein at least one of the performing one or more calculations, the sampling the one or more measurements, or the selecting the subset m of the N number of targets is carried out by at least one computer processor.

21. The method of claim 20, further comprising:
selecting a subset n of the N number of targets, wherein the subset n of the N number of targets includes a smaller number of targets than the N number of targets;
selecting the number of quantiles q; and
sampling a selected number of targets from each quantile q, wherein the selected number of targets is equal to or proportional to the ratio between the values n and q.

22. The method of claim 21, further comprising:
estimating at least one of an accuracy score or a robustness score for the representation of the distribution by a subset n of the N number of targets,
wherein at least one of the values n, q, or the ratio between the values n and q is determined,
wherein at least one of the values n, q, or the ratio between the values n and q is repeatedly varied.

23. The method of claim 22, wherein the varied at least one of the values n, q, or the ratio between the values n and q are based on respective accuracy scores, wherein the determined at least one of the values n, q, or the ratio between the values n and q are based on a robustness score of the respective accuracy scores.

24. The method of claim 23, further comprising:
defining a representation criterion based on the distribution of the one or more measurements of the N number of targets; and
calculating the accuracy score based on the defined representation criterion.

25. The method of claim 22, further comprising:
defining a representation criterion based on the distribution of the one or more measurements of the N number of targets; and
calculating the accuracy score based on the defined representation criterion.

26. The method in claim 20, wherein the one or more correctable terms reduce at least one of a sample size selection or a measurement duration of the metrology tool.

27. A system, comprising:
a metrology tool; and
one or more processors communicatively coupled to non-transitory computer readable storage medium, wherein the non-transitory computer readable storage medium includes computer readable program, wherein the one or more processors are configured to execute the computer readable program configured to cause the one or more processors to:
define a representation criterion;
acquire one or more measurements of an N number of targets;
select a subset n of the N number of targets, wherein the subset n of the N number of targets includes a smaller number of targets than the N number of targets;
select one or more quantiles q based on a distribution of the one or more measurements of the N number of targets;
sample a selected number of targets from each quantile q of the distribution, wherein the selected number of targets is equal to or proportional to the ratio between the values n and q;
calculate at least one accuracy score for the sampled selected number of targets equal to or proportional to the ratio between the values n and q to quantify an amount the sampled selected number of targets equal to or proportional to the ratio between the values n and q represent the distribution of the one or more measurements of the N number of targets;
reiterate at least one of the sampling the selected number of targets equal to or proportional to the ratio between the values n and q, the selecting of the subset n, the selecting of the number of quantiles q, or the calculating the at least one accuracy score until the at least one accuracy score is below the defined representation criterion;
select a subset m of the N number of targets after the calculated at least one accuracy score is below the defined representation criterion, wherein the subset m of the N number of targets includes a smaller number of targets than the N number of targets;
acquire one or more measurements of the subset m of the N number of targets;
determine one or more correctable terms based on the one or more measurements of the subset m of the N number of targets; and
adjust one or more sample selection criterion utilized by the metrology tool based on the one or more correctable terms,
wherein at least one of the selecting the subset n, the selecting the number of quantiles q, the sampling the selected number of targets equal to or proportional to the ratio between the values n and q, or the calculating at least one accuracy score is carried out by at least one computer processor.

28. The system in claim 27, wherein the one or more correctable terms reduce of at least one of a sample size selection or a measurement duration of the metrology tool.

29. A system, comprising:
a metrology tool; and
one or more processors communicatively coupled to non-transitory computer readable storage medium, wherein the non-transitory computer readable storage medium includes computer readable program, wherein the one or more processors are configured to execute the computer readable program configured to cause the one or more processors to:
acquire one or more measurements of an N number of targets of at least one wafer;
perform one or more calculations on the one or more measurements of the N number of targets;
select a subset m of an N number of targets based on the performed one or more calculations, wherein the subset m of the N number of targets includes a smaller number of targets than the N number of targets, wherein the subset m represents a distribution of the one or more metrology parameters of the N number of targets, wherein the subset m of the N number of targets is selected by sampling a selected number of one or more measurements from each of a selected number of quantiles q of the distribution of the one or more measurements of the N number of targets, wherein the selected number of the one or more measurements is equal to or proportional to the ratio between the values m and q;
acquire one or more measurements of the subset m of the N number of targets;
determine one or more correctable terms based on one or more measurements of the subset m of the N number of targets; and
adjust one or more sample selection criterion utilized by the metrology tool based on the one or more correctable terms,
wherein at least one of the performing the one or more calculations, the sampling the one or more measurements, or the selecting the subset m of the N number of targets is carried out by at least one computer processor.

30. The system in claim 29, wherein the one or more correctable terms reduce of at least one of a sample size selection or a measurement duration of the metrology tool.

* * * * *